United States Patent
Grunzweig et al.

(10) Patent No.: US 10,761,022 B2
(45) Date of Patent: Sep. 1, 2020

(54) ROTATED BOUNDARIES OF STOPS AND TARGETS

(71) Applicant: KLA-Tencor Corporation, Milpitas, CA (US)

(72) Inventors: Tzahi Grunzweig, Hillsboro, OR (US); Alexander Svizher, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/083,946

(22) Filed: Mar. 29, 2016

(65) Prior Publication Data

US 2016/0209327 A1 Jul. 21, 2016

Related U.S. Application Data

(63) Continuation of application No. PCT/US2015/037167, filed on Jun. 23, 2015.

(60) Provisional application No. 62/016,267, filed on Jun. 24, 2014.

(51) Int. Cl.
| | |
|---|---|
| *G01N 21/47* | (2006.01) |
| *G03F 7/20* | (2006.01) |
| *G06F 30/39* | (2020.01) |
| *G01N 21/956* | (2006.01) |

(52) U.S. Cl.
CPC ..... *G01N 21/4785* (2013.01); *G01N 21/4788* (2013.01); *G03F 7/70633* (2013.01); *G03F 7/70683* (2013.01); *G06F 30/39* (2020.01); *G01N 21/956* (2013.01)

(58) Field of Classification Search
CPC ............ G01N 21/4788; G03F 7/70683; G03F 9/7088; G03F 7/70633; G03F 9/7084; G03F 9/00

USPC ................. 356/399–401, 445, 625
See application file for complete search history.

(56) References Cited

U.S. PATENT DOCUMENTS

| | | | | |
|---|---|---|---|---|
| 4,734,550 A | * | 3/1988 | Imamura | B23K 26/0732 219/121.61 |
| 5,171,999 A | * | 12/1992 | Komatsu | G03F 9/7049 250/548 |
| 5,267,012 A | * | 11/1993 | Sasnett | G01J 1/4257 356/121 |
| 6,151,102 A | * | 11/2000 | Nishi | G03F 7/70358 250/584 |
| 7,595,482 B2 | * | 9/2009 | Nakayama | G01B 15/00 250/252.1 |
| 8,908,175 B1 | * | 12/2014 | Kandel | G01N 21/211 356/237.4 |
| 2002/0060793 A1 | | 5/2002 | Fukui | |

(Continued)

FOREIGN PATENT DOCUMENTS

| | | |
|---|---|---|
| CN | 103201682 A | 7/2013 |
| JP | 2005175270 | 6/2005 |

OTHER PUBLICATIONS

Office Action dated Jan. 2, 2019 for CN Patent Application No. 201580034258.6.

*Primary Examiner* — Isiaka O Akanbi
(74) *Attorney, Agent, or Firm* — Suiter Swantz pc llo

(57) ABSTRACT

A scatterometry metrology system, configured to measure diffraction signals from at least one target having respective at least one measurement direction, the scatterometry metrology system having at least one field stop having edges which are slanted with respect to the at least one measurement direction.

21 Claims, 6 Drawing Sheets

(56) References Cited

U.S. PATENT DOCUMENTS

| | | | |
|---|---|---|---|
| 2003/0184856 A1* | 10/2003 | Otaki | G02B 7/28 |
| | | | 359/383 |
| 2004/0033426 A1* | 2/2004 | Den Boef | G03B 27/32 |
| | | | 430/22 |
| 2004/0179190 A1* | 9/2004 | Miyashita | G03F 7/706 |
| | | | 356/124 |
| 2006/0033921 A1* | 2/2006 | Den Boef | G03F 7/70341 |
| | | | 356/446 |
| 2008/0198467 A1 | 8/2008 | Nakayama | |
| 2008/0231846 A1* | 9/2008 | Ogawa | G02B 7/32 |
| | | | 356/237.5 |
| 2008/0259343 A1* | 10/2008 | Den Boef | G01N 21/47 |
| | | | 356/446 |
| 2009/0262362 A1 | 10/2009 | de Groot et al. | |
| 2009/0279091 A1 | 11/2009 | Levinski et al. | |
| 2011/0069312 A1* | 3/2011 | Kandel | G01B 11/02 |
| | | | 356/369 |
| 2011/0075238 A1* | 3/2011 | Sewell | G03F 9/7076 |
| | | | 359/241 |
| 2011/0194092 A1 | 8/2011 | Smilde et al. | |
| 2012/0044495 A1* | 2/2012 | Straaijer | G03F 7/70625 |
| | | | 356/369 |
| 2012/0123581 A1* | 5/2012 | Smilde | G03F 7/70483 |
| | | | 700/105 |
| 2013/0114085 A1* | 5/2013 | Wang | G01N 21/55 |
| | | | 356/445 |

\* cited by examiner

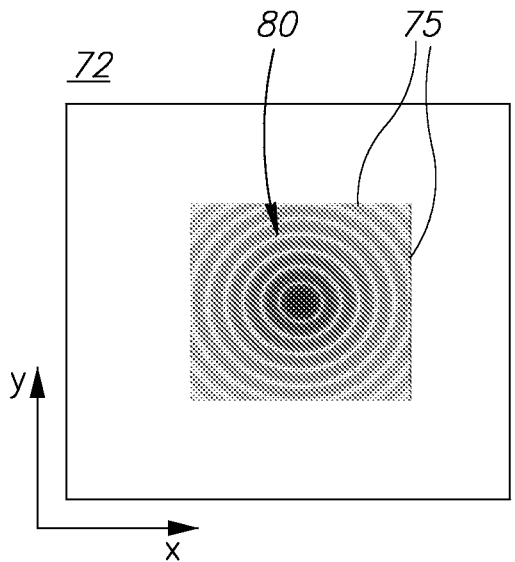
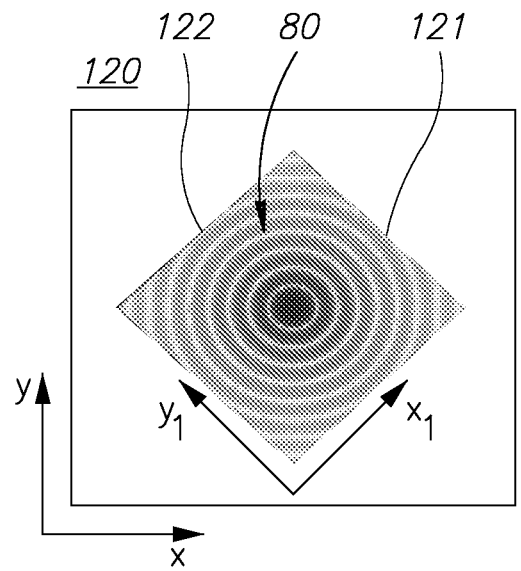
Figure 2A
PRIOR ART
Figure 2B
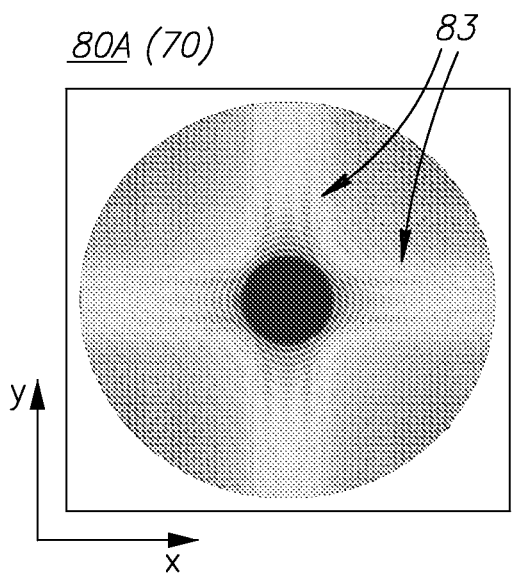
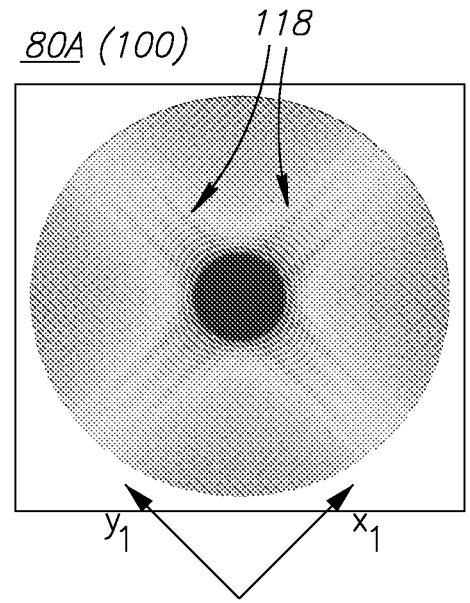
Figure 3A
PRIOR ART
Figure 3B

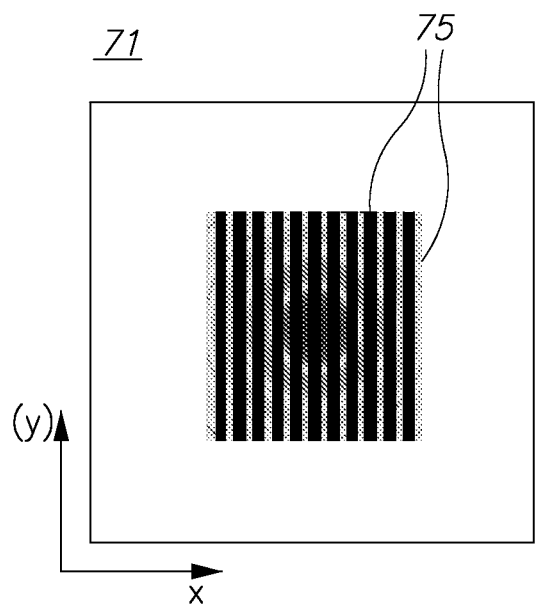
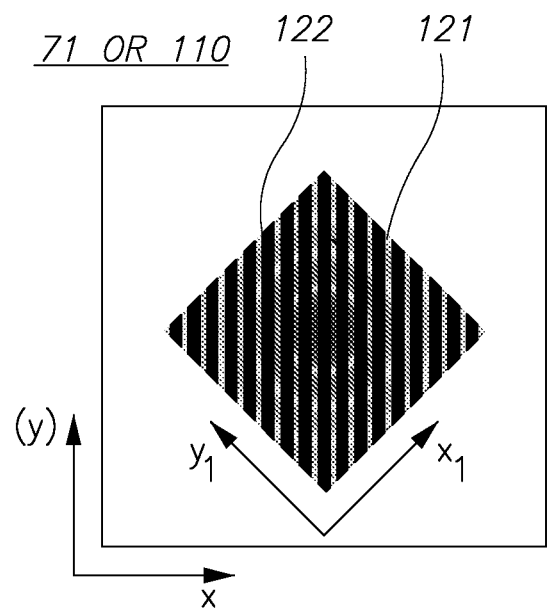
Figure 4A
PRIOR ART
Figure 4B
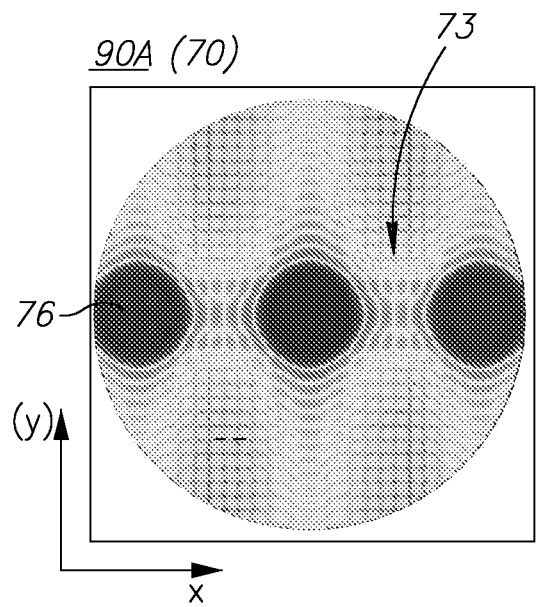
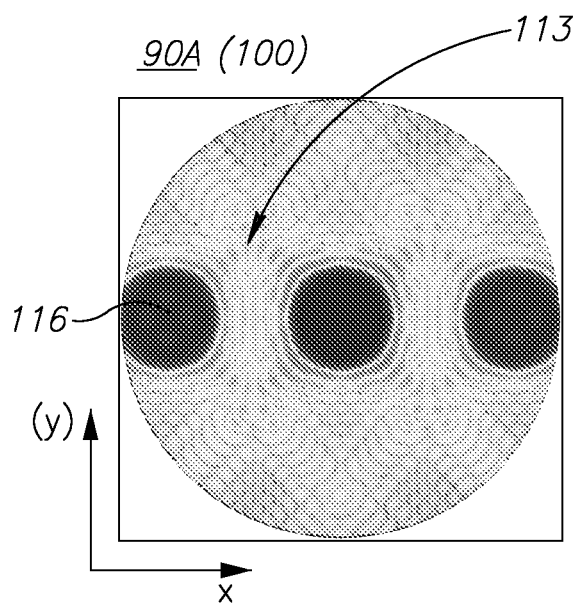
Figure 5A
PRIOR ART
Figure 5B

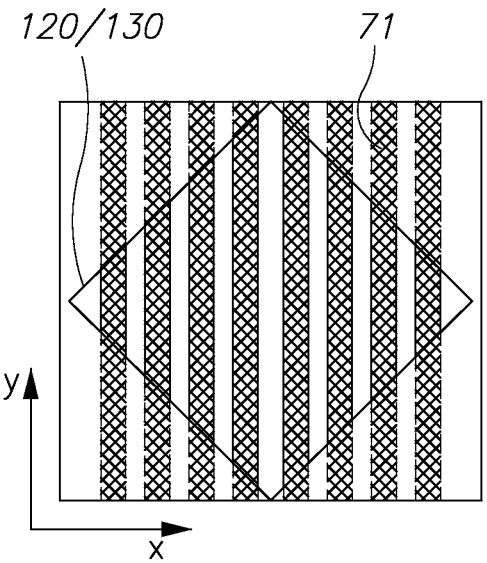 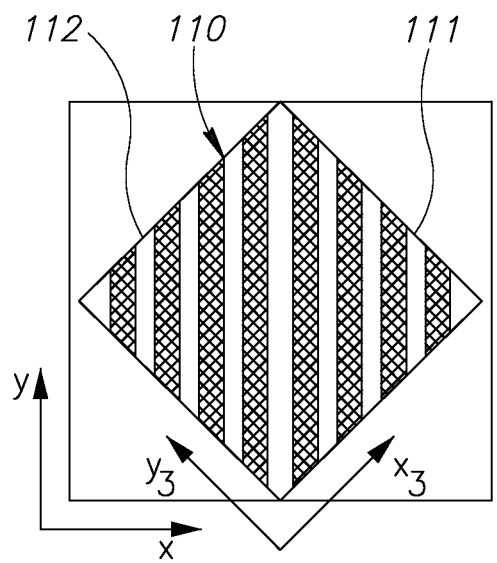
Figure 8A          Figure 8B
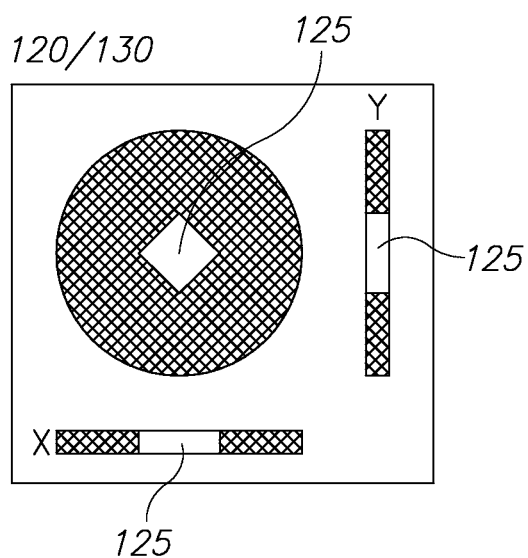 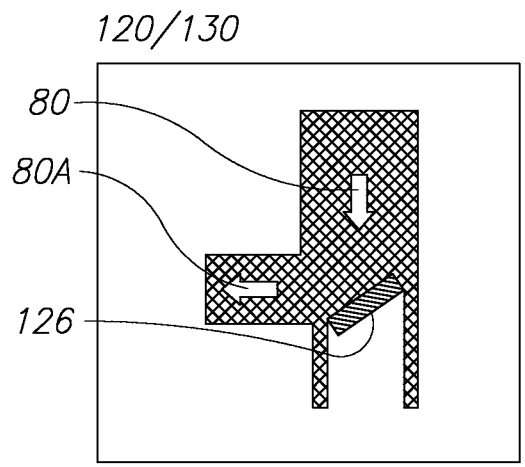
Figure 9A          Figure 9B

ROTATED BOUNDARIES OF STOPS AND TARGETS

CROSS-REFERENCE TO RELATED APPLICATIONS

This application is filed under 35 U.S.C. § 111(a) and § 365(c) as a continuation of International Patent Application No. PCT/US2015/037167, filed on Jun. 23, 2015, which application claims the benefit of U.S. Provisional Patent Application No. 62/016,267, filed on Jun. 24, 2014, which applications are incorporated herein by reference in their entireties.

TECHNICAL FIELD

The present invention relates to the field of metrology, and more particularly, to scatterometry metrology optical systems and targets.

BACKGROUND OF THE INVENTION

Overlay offset measurement is implemented by an angle resolved scatterometry technology, such as the 4-cell measurement technology. In this arrangement, an illumination radiation is incident on a "grating on grating" target. The target scatters the illumination radiation to form a scattered radiation. A part of the scattered radiation undergoes diffraction by the target. The resulting scattered radiation pattern consists of several diffracted orders, according to the grating equation. This scattered radiation is then collected and analyzed, where the spatial and/or angular distribution of the diffracted light is used to estimate the overlay offset between the layers of the "grating over grating" target.

In typical lithography processes, the optimal direction of the grating is dictated by the lithography illumination pattern. Typically a dipole or quadrapole illumination is used to minimize the critical dimension of the structures, and the grating direction is fixed by the choice of illumination.

U.S. Patent Publication No. 2011/0194092 discloses rotating the actual target grating, which raises a large number of applicative problems. U.S. Patent Publication No. 2011/0194092 maintains the target periodicity itself and does not maintain the direction target periodicity nor modify field stop boundaries and/or target boundaries.

SUMMARY OF THE INVENTION

The present invention comprises a scatterometry metrology system, configured to measure diffraction signals from at least one target having respective at least one measurement direction, the scatterometry metrology system having at least one field stop having edges which are slanted with respect to the at least one measurement direction.

The present invention also comprises a scatterometry metrology measurement by a scatterometry metrology system configured to measure diffraction signals from at least one target having respective at least one measurement direction, the scatterometry metrology system having at least one field stop having edges which are slanted with respect to the at least one measurement direction.

The present invention also comprises a scatterometry metrology target having at least one periodic structure along at least one respective measurement direction, wherein edges of the target are slanted with respect to the at least one measurement direction.

The present invention also comprises a target design file of the scatterometry metrology targets of a scatterometry metrology target having at least one periodic structure along at least one respective measurement direction, wherein edges of the target are slanted with respect to the at least one measurement direction.

The present invention also comprises a scatterometry metrology measurement of a scatterometry metrology target having at least one periodic structure along at least one respective measurement direction, wherein edges of the target are slanted with respect to the at least one measurement direction.

The present invention also comprises a scatterometry metrology method having the step of designing, in a scatterometry metrology system for measuring at least one scatterometry metrology target having at least one periodic structure along at least one respective measurement direction, edges of at least one of: at least one field stop in the system and the at least one target, to be slanted with respect to the at least one measurement direction.

Scatterometry metrology systems, targets and methods are provided, which reduce or remove edge diffractions from target diffraction signals. Boundaries of field stops and/or of targets may be designed to be slanted with respect to the measurement directions, to cause edge diffraction to propagate obliquely and thus reduce or remove its effects on the measured target diffraction signals.

Embodiments of the disclosed invention overcome the following limitations of the prior art. As actual targets are finite, the incident illumination is diffracted by both the grating structure (grating diffraction) and by the boundaries of the grating structure (edge diffraction). Grating diffraction is desired, as it provides information on the grating, while edge diffraction is undesired because it interferes with the grating diffraction and decreases the usable grating diffraction signal. The mechanism of performance deterioration is as follows: Edge diffraction manifests itself in the pupil plane, as a convolution of the grating-diffracted light with a pattern associated with the edge diffraction. The effects of all the edge diffraction in the optical system contributes to the system's Point Spread Function (PSF) and specifically may make PSF more spatially extended, Effectively this means that some of the grating diffracted radiation is further diffracted by the edge diffraction, possibly overlapping with different orders if the grating diffracted radiation. This phenomenon degrades the performance of an angle resolved scatterometer.

Furthermore, the edge diffraction mixes light from different orders of the grating diffraction pattern. The details of this mixing depend strongly on measurement parameters (such as element position, target orientation etc.). It follows then that measurement instabilities result in stronger loss of repeatability when edge diffraction is present. Additionally, the edge diffraction can be asymmetric with respect to the target grating. As a scatterometry overlay measurement makes use of symmetry properties of the target and the tool, such an asymmetric contribution will result in an accuracy error.

Specifically in overlay measurements, edge diffraction may lead to loss of performance and accuracy by any of the following mechanisms: (i) Mixing light from different orders, which is not accounted for by the overlay algorithm; (ii) mixing the light in an asymmetric way, which can register as an overlay; (iii) the overlay's high sensitivity to position leads through positioning variation to loss in repeatability; and (iv) specifically in 4-cell scatterometry, diffraction mixes zero order into the first order light in two ways, namely a DC contribution proportional to the intensity of the zero order and an AC contribution proportional to both to the zero order field amplitude, and the first order field amplitude.

As different diffraction orders "cross-talk" by diffraction, providing a source of performance and accuracy loss, and as the diffraction is primarily from the edge of the target (e.g., the edge of a target cell), field stops and pupil stops in the optical path in the tool, the present invention which changes, or rotates, the diffracting elements (cell boundaries, field stops and pupil stops), directs thereby the diffraction away from regions of interest and reduce the interruptions to accurate measurement of the diffraction signal originating from the actual target. It is emphasized that embodiments may modify at least one of the target edges, edges of any of the field stops in the system and edges pupil stops (at an incoming radiation pupil plane and/or at a scattered radiation pupil plane), either of the latter by modifying corresponding apertures.

Embodiments of the present invention rotate the target boundaries while maintaining the spatial periodicity direction of the target and hence measurement direction. Embodiments of the present invention do not alter the grating direction, but, instead, modify the target boundaries, thus becoming process-compatible and resulting in better produced grating targets while mitigating the effect of target and stops edge diffractions.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 2A is a schematic representation of incoming radiation as viewed at a field equivalent plane at illumination field stop according to the prior art;

FIG. 2B is a schematic representation of incoming radiation as viewed at a field equivalent plane at the illumination field stop, according to some embodiments of the invention;

FIG. 3A is a schematic representation of incident radiation as viewed at the pupil in systems according to the prior art;

FIG. 3B is a schematic representation of incident radiation as viewed at the pupil in systems according to some embodiments of the invention;

FIG. 4A is a schematic representation of radiation incident on target (at a field equivalent plane) in systems according to the prior art;

FIG. 4B is a schematic representation of radiation incident on targets (at a field equivalent plane) in systems according to some embodiments of the invention;

FIG. 5A is a schematic representation of scattered radiation (at a pupil equivalent plane) in systems according to the prior art;

FIG. 5B is a schematic representation of scattered radiation (at a pupil equivalent plane) in systems according to some embodiments of the invention;

FIG. 8A is a schematic illustration of a target with superimposed edges of a field stop, according to some embodiments of the invention;

FIG. 8B is a schematic illustration of targets according to some embodiments of the invention;

FIG. 9A schematically illustrates field stop configurations, according to some embodiments of the invention:

FIG. 9B schematically illustrates field stop configurations, according to some embodiments of the invention; and, FIG. 10 is a high level schematic flowchart illustrating a method, according to some embodiments of the invention.

DETAILED DESCRIPTION OF THE INVENTION

Figure 1:
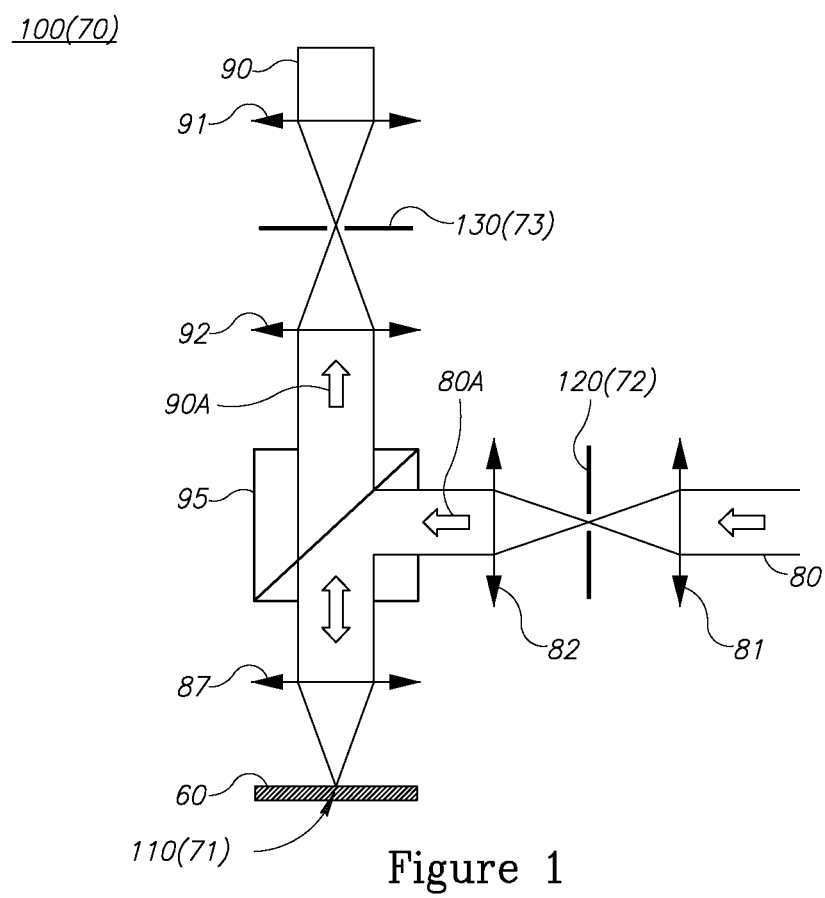
FIG. 1 is a high level illustration of scatterometry metrology system, according to some embodiments of the invention.

At the outset, it should be appreciated that like reference characters on different drawing views identify identical, or functionally similar, structural elements of the invention. While the present invention is described with respect to what is presently considered to be the preferred aspects, it is to be understood that the invention as claimed is not limited to the disclosed aspect. Also, it is to be understood that the invention is not limited in its application to the details of construction and the arrangement of the components set forth in the following description or illustrated in the drawings. The invention is applicable to other embodiments or of being practiced or carried out in various ways and is intended to include various modifications and equivalent arrangements within the spirit and scope of the appended claims.

Furthermore, it is understood that this invention is not limited to the particular methodology, materials and modifications described and as such may, of course, vary. It is also understood that the terminology used herein is for the purpose of describing particular aspects only, and is not intended to limit the scope of the present invention, which is limited only by the appended claims.

Unless defined otherwise, all technical and scientific terms used herein have the same meaning as commonly understood to one of ordinary skill in the art to which this invention belongs. Although any methods, devices or materials similar or equivalent to those described herein can be used in the practice or testing of the invention, the preferred methods, devices, and materials are now described.

In the below description, an embodiment is an example or implementation of the invention. The various appearances of "one embodiment", "an embodiment", "certain embodiments" or "some embodiments" do not necessarily all refer to the same embodiments.

The terms "metrology target", "scatterometry target" or "target" as used herein in this application, are defined as structures designed or produced on a wafer which are used for metrological purposes such as scatterometry overlay (SCOL) measurements. The terms "metrology measurement" or "measurement" as used herein in this application, are defined as any metrology procedure used to extract information such as diffraction signals from metrology targets. The term "periodic structure" as used in this application refers to any kind of designed or produced structure in at least one layer which exhibits some periodicity. The term "measurement direction" as used in this application refers to the direction along which the periodic structure is periodic. For example, the measurement direction of a grating as the periodic structure is perpendicular to the target elements which constitute the grating. Targets may have more than one measurement direction, for example two perpendicular measurement directions FIG. 1 is a high level illustration of scatterometry metrology system 100, according to some embodiments of the invention. The illustration concentrates on the optics and target in system 100 and is non-limiting with respect to other parts of system 100 (e.g., light sources and detectors) nor with respect to the specifically illustrated elements. FIG. 1 illustrates field stops 120, 130 and target 110 as exemplary elements at the field plane of the system's optics, yet the invention may be extended to other elements located at the field plane of system 100. Prior art optical systems 70 are characterized by prior art field stops 72, 73 at optical positions which are equivalent to field stops 120, 130) and targets 71.

FIG. 1 is a schematic of the optical head of an angle resolved scatterometer as a non-limiting example for scatterometry metrology system 100. Collimated incoming radiation 80 is focused by a lens 81 to an illumination field stop 120 and then collimated by a lens 82 and directed as incident radiation 80A by a beam splitter 95 over a focusing lens 87 to afield target 110 on a wafer 60. The scattered light from target 110 is collected by lens 87, directed by beam splitter 95 as outgoing radiation 90A and focused by a lens 92 to a collection field stop 130, and then collimated again by lens 91 to form the scattered radiation 90 collected by the sensor as an example for pupil plane imaging used in scatterometry). It is noted that illumination field stop 120, target 110 and collection field stop 130 are all in field planes, while the incoming radiation 80 and scattered radiation 90 may be handled with respect to a pupil plane in each corresponding section. Specifically, diffraction by field stops 120, 130 and by target 110 spatially translates scattered radiation 90 in the pupil plane.

As the optical field stops limit the spatial extent of the radiation in the field planes, the target has a finite extent and a border to separate it from its surroundings. Both the optical field stops and the target introduce edge diffraction which are undesirable. Certain arrangements of the field stops and/or of the target edges reduce the interruptions caused by edge diffraction.

In certain embodiments, in optical stop arrangements, e.g., having opaque optical stop with a square radiation transmission area, the square opening may be rotated relative to the grating direction. In general, the term "edge diffraction" is used to refer to diffraction come from either step-like edges, or from smooth, or gradual edges. Disclosed embodiments may be applicable to any type of edge and the examples given for step-like edge are not limiting in this sense, but are used merely as they are visualized better. Certain embodiments may be applied to soft edges which introduce a few more degrees of freedom (e.g., the direction and steepness of the edge gradient) Which may be taken into account in the reconfiguration of the corresponding stop edges according to the disclosed principle that light diffracts stronger along the direction in which it is stronger constrained.

It is noted that certain embodiments comprise, in addition or in place of reducing the effects of edge diffraction for a given stop area, decreasing the stop area while keeping the edge diffraction fixed (with reference to one or more stops in the system). For example, the target itself, acting as a stop; the collection field stop may be made smaller to block more undesired light, like ghost images, from being collected; and the illumination field stop may be made smaller to eliminate unwanted light, like ghost images, from being directed to the target.

In order to exemplify, in a non-liming manner, the structure and functioning of certain embodiments, the following pairs of figures illustrate a comparison between prior art systems 70 and system 100 at different locations along the optical path of the radiation.

FIG. 2A is a schematic representation of incoming radiation 80 as viewed at a field equivalent plane at illumination field stop 72 according to the prior art, while FIG. 2B is a schematic representation of incoming radiation 80 as viewed at a field equivalent plane at illumination field stop 120, according to some embodiments of the invention. In a non-limiting manner, FIG. 2B illustrates a square optical field stop which is rotated with respect to prior art field stops, causing edge diffractions to propagate at an angle with respect to the horizontal and vertical axes of the pupil plane which are the target measurement directions.

Certain embodiments comprise a scatterometry metrology system 100, configured to measure diffraction signals 90 from at least one target 71 and/or 110 having respective at least one measurement direction (e.g., x, y). While in prior art systems 70, illumination field stop 72 has edges 75 which are perpendicular to target 71's measurement directions (x, y), scatterometry metrology system 100 has at least one field stop (e.g., illumination field stop 120) having edges 121, 122 which are slanted (e.g., $x_1$, $y_1$) with respect to the at least one measurement direction (x, y).

FIG. 3A is a schematic representation of incident radiation 80A as viewed at the pupil plane (objective pupil, log intensity, simulated radiation intensity pattern) in systems 70 according to the prior art, while FIG. 3B is a schematic representation of incident radiation 80A as viewed at the pupil plane (objective pupil, log intensity, simulated radiation intensity pattern) in systems 100, according to some embodiments of the invention. It is noted that while in prior art systems 70 edge diffraction patterns 83 are formed perpendicularly to stop edges 75 in measurement directions (x,y), in systems 100 edge diffraction patterns 118 are slanted with respect to measurement directions (x,y) as they are perpendicular to slanted stop edges 121, 122 and hence at directions ($x_1$, $y_1$) for rectangular stops 120 (as a non-limiting example).

FIG. 4A is a schematic representation of radiation 80A incident on target 71 (at a field equivalent plane) in systems 70 according to the prior art, while FIG. 4B is a schematic representation of radiation 804 incident on target 71 or 110 (at a field equivalent plane) in systems 100, according to some embodiments of the invention. In the illustrated non-limiting example, target 71 or 110 comprises a periodic structure in one direction (x) having a corresponding measurement direction. Edges 75 of illumination stop 72 and edges 121, 122 of illumination stop 120 determine the spatial extent of incident illumination 80A, and emphasize the oblique configuration of edge verticals $x_1$, $y_1$ with respect to target measurement direction's x, y.

FIG. 5A is a schematic representation of scattered radiation 904 (at a pupil equivalent plane) in systems 70 according to the prior art, while FIG. 5B is a schematic representation of scattered radiation 904 (at a pupil equivalent plane) in systems 100, according to some embodiments of the invention. It is clear that while in prior art systems 70 edge diffraction patterns 73 in measurement direction x interfere with a diffraction signal 76 from target 71 (e.g., shown are diffractions orders 0, ±1), in systems 100 edge diffraction patterns 113 are slanted (in directions $x_1$, $y_1$) with respect to measurement direction x and interfere more weakly with a diffraction signal 116 from target 71 or 110 (e.g., shown are diffractions orders 0, ±1). Clearly, similar considerations are applicable to targets 71, 110 with two (or more) measurement directions x, y.

Figure 6A:
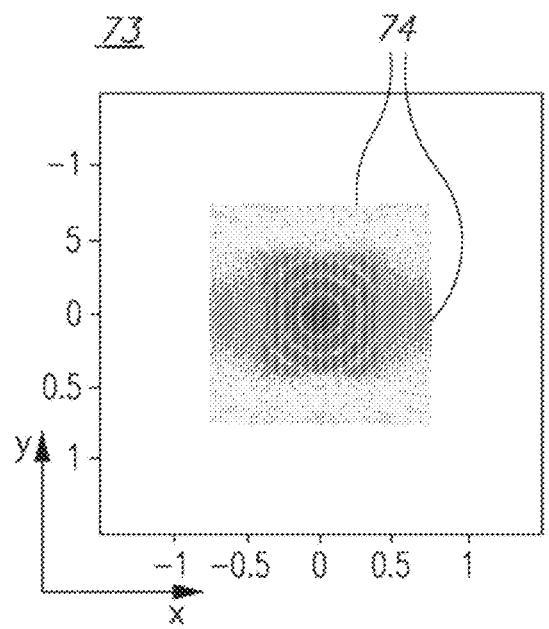
FIG. 6A is a schematic representation of scattered radiation as viewed at a field equivalent plane at the collection field stop according to the prior art.
Figure 6B:
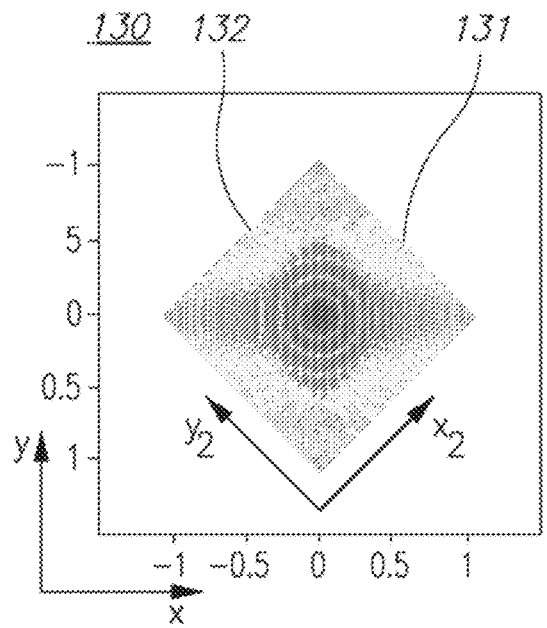
FIG. 6B is a schematic representation of scattered radiation as viewed at a field equivalent plane at the collection field stop, according to some embodiments of the invention.

FIG. 6A is a schematic representation of scattered radiation 90A as viewed at a field equivalent plane at collection field stop 73 according to the prior art, while FIG. 6B is a schematic representation of scattered radiation 90A as viewed at a field equivalent plane at collection field stop 130, according to some embodiments of the invention.

Certain embodiments comprise a scatterometry metrology system 100, configured to measure diffraction signals 90 from at least one target 71 and/or 110 having respective at least one measurement direction (e.g., x, y). While in prior art systems 70, collection field stop 73 has edges 74 which are perpendicular to target 71's measurement directions (x, y), scatterometry metrology system 100 has at least one field stop (e.g., collection field stop 130) having edges 131, 132 which are slanted (e.g., $x_2$, $y_2$) with respect to the at least one measurement direction (x, y). Edges 131, 132 of collection field stop 130 may be slanted similarly to edges 121, 122 of illumination field stop 120 ($x_1, y_1 = x_2, y_2$) or stop edges may be slanted differently ($x_1, y_1 \neq x_2, y_2$), it is noted that edges of either or both stops 120, 130 may be slanted (FIG. 6B illustrates the latter case in as a non-limiting example).

Figure 7A:
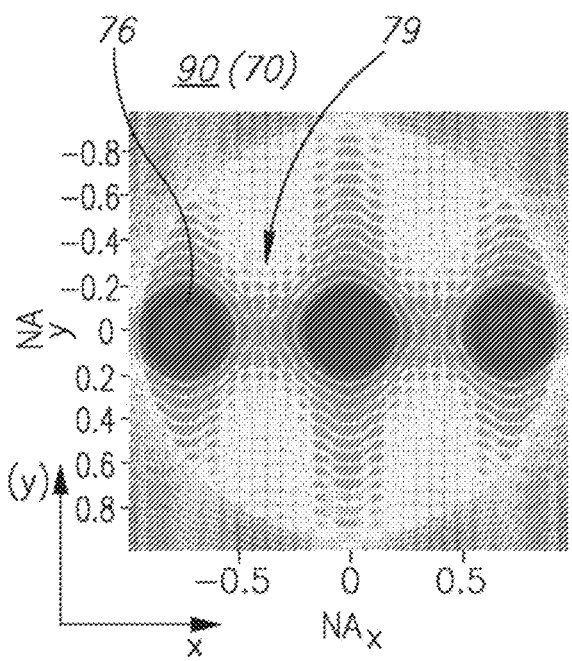
FIG. 7A is a schematic representation of the diffraction signal (at the pupil plane) in systems according to the prior art.
Figure 7B:
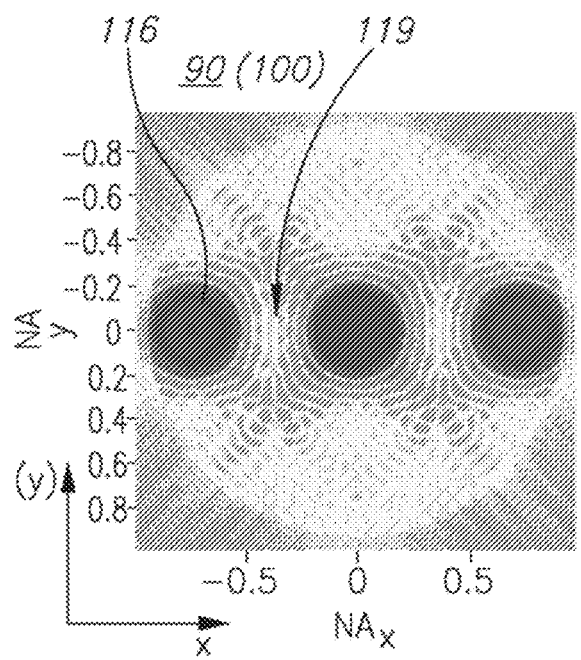
FIG. 7B is a schematic representation of the diffraction signal (at the pupil plane) in systems according to some embodiments of the invention.

FIG. 7A is a schematic representation of diffraction signal 90 (at the pupil plane) in systems 70 according to the prior art, while FIG. 7B is a schematic representation of diffraction signal 90 (at the pupil plane) in systems 100, according to some embodiments of the invention. While in prior art systems 70 edge diffraction patterns 79 in measurement direction x interfere with a diffraction signal 76 from target 71 (e.g., shown are diffractions orders 0, ±1), in systems 100 edge diffraction patterns 119 are slanted (in directions $x_1$, $y_1 = x_2$, $y_2$ in the illustrated example, possibly in other patterns when edge directions differ) with respect to measurement direction x and interfere more weakly with a diffraction signal 116 from target 71 or 110 (e.g., shown are diffractions orders 0, ±1). Clearly, similar considerations are applicable to targets 71, 110 with two (or more) measurement directions x, y, as seen in FIG. 7B at the vertical measurement direction (y) with respect to diffraction signals 116.

It is noted that the rotated square stop may be implemented in the illumination path of the measurement device and/or in the collection path of the measurement device. Both implementations are independently beneficial, and the combination of the two rotated square stops (illumination and collection field stops) combines the benefits of the individual implementations.

The angle between field stop edges (any of 121, 122, 131, 132) and the measurement directions (any of x, y) may be between 30°-60°, and in certain embodiments, such as rotated rectangular stops for measuring targets with two perpendicular measurement directions, may comprise 45°. It is noted that for small illumination radii and/or for larger distances between orders than illustrated, smaller angles than 30° or larger angles than 60° may suffice to reduce or remove the effects of edge diffraction on the measured target diffraction signals by to propagating the edge diffraction obliquely. For example, angles as small as 20°, 10°, 5° or in certain cases even 1°, as well as intermediate values and complementary values to 90° (i.e., 70°, 80°, 85°, 89°) may be applied to edged elements in the optical system.

FIG. 8A is a schematic illustration of target 71 with superimposed edges of a field stop 120 and/or 130, according to some embodiments of the invention. The field stop is slanted, or rotated, with respect to the direction of spatial periodicity of target 71, i.e., measurement direction x. FIG. 8B is a schematic illustration of target 110, according to some embodiments of the invention. While the direction of spatial periodicity of target 110, i.e., measurement direction x, is horizontal in FIG. 8B, target edges 111, 112 are slanted (along directions $x_3$, $y_3$) with respect to measurement direction x. Certain embodiments of scatterometry metrology target 110 have at least one periodic structure along at least one respective measurement direction, wherein edges 111, 112 of target 110 are slanted with respect to the at least one measurement direction. For example, target edges 111, 112 may form a rectangle rotated at 30°-60° from the at least one measurement direction (x and/or y). In a non-limiting example, target edges 111, 112 may form a rectangle rotated at 45° from the at least one measurement direction. As explained above, depending on the configuration of the illumination spots and diffraction orders, rotations may be carried out at a wider range of angles, eventually extending between 1°-89°.

Target edges 111, 112 may be slanted at a same or at a different angle to the measurement direction(s) as edges 121, 122 of illumination pupil 120 and/or edges 131, 132 of collection pupil 130 ($x_3, y_3 =$ or $\neq x_1, y_2$ and/or $x_2, y_2$). Target boundaries may be arranged, relative to the grating direction, such that diffraction from the target edges, which propagates to a region of interest in the pupil plane, is diminished. For example, target boundaries may be rotated with respect to the grating measurement directions. As the edge diffraction is directed in perpendicular to the target edges, and extends further in that direction, for targets with rotated edges, the edge diffractions propagate at an angle to the x and y axes of the pupil plane. The effect thus created is similar to the effects of rotated field stop illustrated in FIGS. 3B, 5B and 7B and may, furthermore, enhanced thereby. The implementations of the rotated square stop as an optical field stop and the rotated target boundary as the target boundary may be realized independently, Both implementations are independently beneficial, and the combination of rotated square stops (at illumination and/or collection field stops 120, 130 respectively) and the rotated target boundary combines the benefits of the individual implementations.

Certain embodiments comprise scatterometry metrology system 100 wherein edges of at least one target 110 are slanted with respect to the at least one measurement direction. Certain embodiments comprise target design files of scatterometry metrology targets 110 described herein, Certain embodiments comprise scatterometry metrology measurements by scatterometry metrology system 100 described herein and/or scatterometry metrology measurements of scatterometry metrology targets 110 described herein.

In certain embodiments, scatterometry metrology system 100 may comprise a correction module (not shown) configured to correct measured scatterometry signals from at least one target 110 using measured diffraction signals of at least one field stop 120, 130.

Edges 121, 122, 131, 132 of stops 120, 130 (respectively) may be configured to limit illumination 80 to target boundaries 111, 112. In certain embodiments, stops 120, 130 and target 110 may have congruent edges then considering the intermediate optical elements such as lenses 82, 87, 92).

FIGS. 9A and 9B schematically illustrate field stop configurations, according to some embodiments of the invention. FIG. 9A schematically illustrates an opaque disc with a rotated square aperture 125 and respective X and Y cross sections illustrating the maximal extent of aperture 125 in measurement directions x, y. FIG. 9B schematically illustrates a mirror 126 which may be shaped as a rotated square and positioned to reflect a portion of incoming radiation 80 to yield incident radiation 80A as a formed beam similar to one passing through aperture 125 and having boundaries as disclosed herein. Other, not illustrated embodiments of stops 120, 130 comprise a diffracting element arranged such that a straight edge is directed at an angle relative to the direction to the center of a region of interest (e.g., with a rectangular effective aperture shape).

Figure 10:
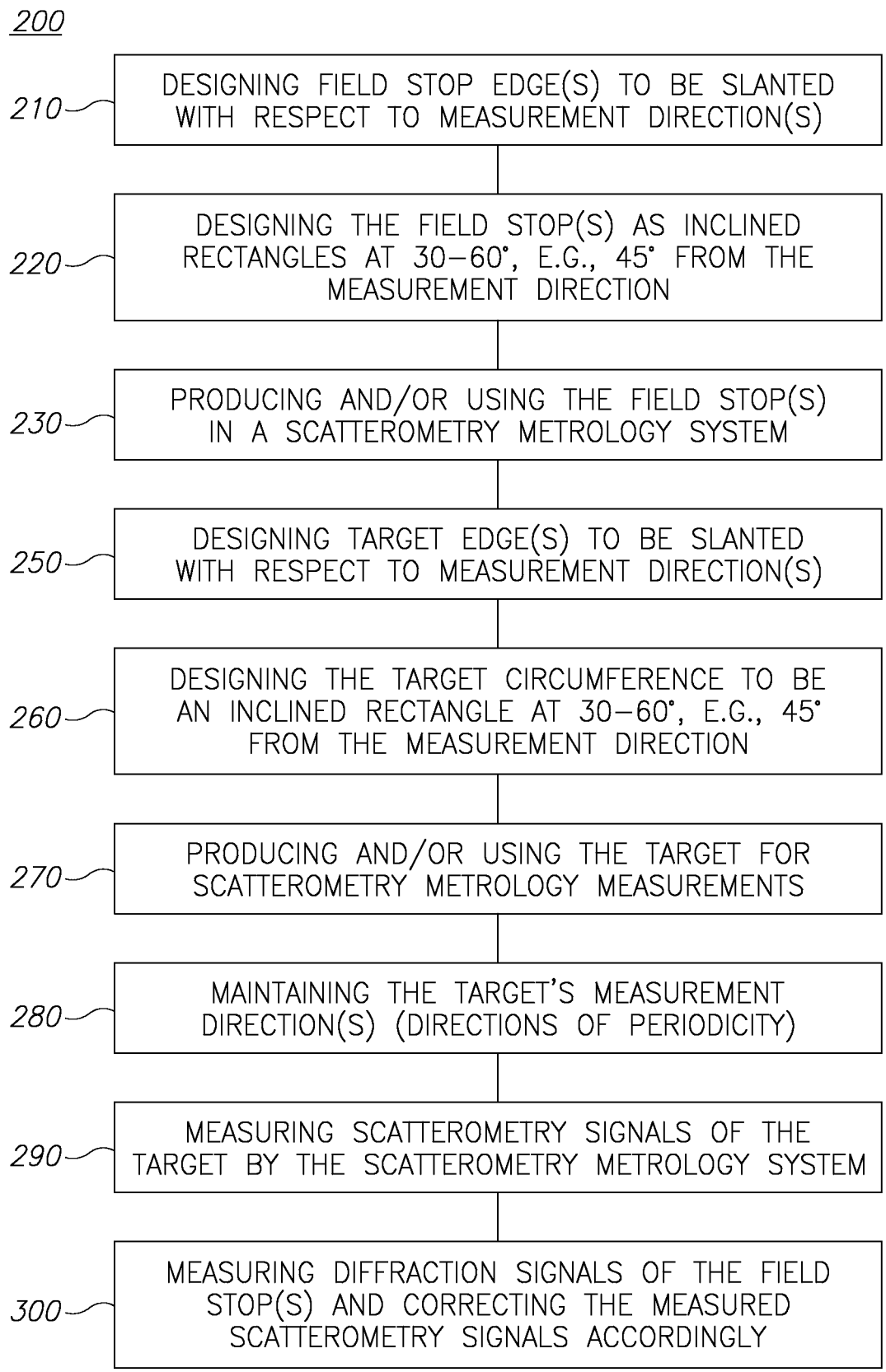

FIG. 10 is a high level schematic flowchart illustrating a method 200, according to some embodiments of the invention.

Method 200 may comprise a scatterometry metrology method comprising designing, in a scatterometry metrology system for measuring at least one scatterometry metrology target having at least one periodic structure along at least one respective measurement direction, edges of at least one of: at least one field stop in the system and the at least one target, to be slanted with respect to the at least one measurement direction. Method 200 may comprise designing field stop edge(s) to be slanted with respect to measurement direction(s) (stage 210) and/or designing target edge(s) to be slanted with respect to measurement direction(s) (stage 250).

In certain embodiments, method 200 comprises designing the field stop(s) edges to be rotated at 30°-60° (e.g., 45°) from the at least one measurement direction, e.g., to form a rectangle (stage 220). In certain embodiments, method 200 comprises designing the target circumference to be rotated at 30°-60° (e.g., 45°) from the at least one measurement direction, e.g., to form a rectangle (stage 260), specifically, while maintaining the target's measurement direction(s) (directions of periodicity) (stage 280). As explained above, depending on the configuration of the illumination spots and diffraction orders, rotations may be carried out at a wider range of angles, eventually extending between 1°-89°.

Method 200 may further comprise producing and/or using the field stop(s) in a scatterometry metrology system (stage 230) and/or producing and/or using the target for scatterometry metrology measurements (stage 270).

Method 200 may further comprise measuring scatterometry signals of the at least one scatterometry metrology target by the scatterometry metrology system (stage 290) and/or measuring diffraction signals of the at least one field stop and correcting the measured scatterometry signals accordingly (stage 300).

The invention is not limited to those diagrams or to the corresponding descriptions. For example, flow need not move through each illustrated box or state, or in exactly the same order as illustrated and described.

Thus, it is seen that the objects of the present invention are efficiently obtained, although modifications and changes to the invention should be readily apparent to those having ordinary skill in the art, which modifications are intended to be within the spirit and scope of the invention as claimed. It also is understood that the foregoing description is illustrative of the present invention and should not be considered as limiting. Therefore, other embodiments of the present invention are possible without departing from the spirit and scope of the present invention as claimed.

What is claimed is:

1. A scatterometry metrology system comprising:
    a light source;
    one or more optical elements positioned to direct illumination from the light source to a target disposed on a sample, the target including at least one periodic structure including elements distributed along one or more measurement directions parallel to a surface of the sample;
    a detector located at a pupil plane;
    one or more optical elements positioned to direct radiation diffracted from the target in response to the illumination from the light source to the detector to generate a pupil plane image of the radiation diffracted from the target for one or more metrology measurements along the one or more measurement directions; and
    one or more field stops located at one or more planes conjugate to the sample, wherein the one or more field stops include one or more straight edges oriented to provide conjugates of the one or more straight edges on the sample along directions oblique to at least one of the one or more measurement directions to at least partially mitigate an influence of diffraction associated with the one or more straight edges on the radiation diffracted from the target in the pupil plane for the one or more metrology measurements along the one or more measurement directions.

2. The scatterometry metrology system of claim 1, wherein at least one of the one or more straight edges is oriented to provide a conjugate on the sample oriented at an angle within a range of approximately 30° to approximately 60° with respect to at least one of the one or more measurement directions.

3. The scatterometry metrology system of claim 2, wherein at least one of the one or more straight edges is oriented to provide a conjugate on the sample oriented at an angle of approximately 45° with respect to at least one of the one or more measurement directions.

4. The scatterometry metrology system of claim 1, further configured to correct measured scatterometry signals from the target using measured diffraction signals of the one or more field stops.

5. The scatterometry metrology system of claim 1, wherein at least one of the one or more field stops comprises:
    an illumination field stop, wherein the illumination field stop includes at least one of the one or more straight edges.

6. The scatterometry metrology system of claim 1, wherein at least one of the one or more field stops comprises:
    a collection field stop, wherein the collection field stop includes at least one of the one or more straight edges.

7. The scatterometry metrology system of claim 6, wherein the illumination field stop includes an first aperture formed from at least some of the one or more straight edges, wherein a conjugate of the first aperture on the sample defines an illuminated portion of the sample, wherein the collection field stop includes a second aperture formed from at least some of the one or more straight edges, wherein a conjugate of the second aperture on the sample defines a detected portion of the sample.

8. The scatterometry metrology system of claim 7, wherein the illuminated portion of the target and the detected portion of the target are congruent.

9. The scatterometry metrology system of claim 7, wherein at least one of the illuminated portion of the sample or the detected portion of the sample is smaller than the target.

10. The scatterometry metrology system of claim 1, wherein the target includes one or more target edges defining a spatial extent of the target, wherein at least one of the one or more target edges is arranged at an oblique angle with respect to at least one of the one or more measurement directions.

11. The scatterometry metrology system of claim 1, wherein the directions oblique to at least one of the one or more measurement directions is within a range of approximately 1° to approximately 89° with respect to the at least one measurement direction.

12. The scatterometry metrology system of claim 1, wherein at least one of the one or more field stops comprises:
an aperture formed from at least some of the one or more straight edges.

13. The scatterometry metrology system of claim 12, wherein the aperture comprises:
a rectangular aperture.

14. The scatterometry metrology system of claim 12, wherein the one or more edges comprise:
at least one of boundaries of an opening in an opaque disk or boundaries of a mirror.

15. A method to mitigate edge diffraction effects in metrology measurements comprising:
receiving a target disposed on a sample, the target including at least one periodic structure including elements distributed along one or more measurement directions in a metrology system parallel to a surface of the sample, the metrology system including one or more optical elements positioned to direct illumination from a light source to the target, the metrology system further including one or more optical elements positioned to direct radiation diffracted from the target in response to the illumination from the light source to a detector located at a pupil plane to generate a pupil plane image of the radiation diffracted from the target for one or more metrology measurements along the one or more measurement directions; and
providing one or more field stops located at one or more planes of the metrology system conjugate to the sample, wherein the one or more field stops include one or more straight edges oriented to provide conjugates of the one or more straight edges on the sample along directions oblique to at least one of the one or more measurement directions to at least partially mitigate an influence of diffraction associated with the one or more straight edges on the radiation diffracted from the target in the pupil plane for the one or more metrology measurements along the one or more measurement directions.

16. The method of claim 15, wherein providing one or more field stops located at one or more planes of the metrology system conjugate to the sample comprises:
orienting at least one of the one or more straight edges to provide a conjugate on the sample oriented at an angle within a range of approximately 1° to approximately 89° with respect to at least one of the one or more measurement directions.

17. The method of claim 15, wherein providing one or more field stops located at one or more planes of the metrology system conjugate to the sample comprises:
orienting at least one of the one or more straight edges to provide a conjugate on the sample oriented at an angle of approximately 45° with respect to at least one of the one or more measurement directions.

18. The method of claim 15, wherein at least one of the one or more field stops comprises:
at least one of an illumination field stop or a collection field stop formed from at least some of the one or more straight edges.

19. A method to mitigate edge diffraction effects in metrology measurements comprising:
fabricating a target on a sample to include at least one periodic structure including features distributed along one or more distribution directions parallel to a surface of the sample, wherein the target includes at least one straight edge defining a boundary of the target arranged oblique to at least one of the one or more distribution directions;
receiving the target on the sample in a metrology system, the metrology system including one or more optical elements positioned to direct illumination from a light source to the target, the metrology system further including one or more optical elements positioned to direct radiation diffracted from the target in response to the illumination from the light source to a detector located at a pupil plane to generate a pupil plane image of the radiation diffracted from the target for one or more metrology measurements along one or more measurement directions; and
aligning at least one of the one or more distribution directions of the target with at least one of the one or more measurement directions of the metrology system to at least partially mitigate an influence of diffraction associated with the at least one straight edge of the target on the radiation diffracted from the target in the pupil plane image for the one or more metrology measurements along the one or more measurement directions.

20. The metrology method of claim 19, further comprising:
providing one or more field stops located at one or more planes of the metrology system conjugate to the sample, wherein the one or more field stops include one or more straight edges oriented to provide conjugates of the one or more straight edges on the sample along directions oblique to at least one of the one or more measurement directions to at least partially mitigate an influence of diffraction associated with the one or more straight edges of the one or more field stops on the pupil plane image for the one or more metrology measurements along the one or more measurement directions.

21. The metrology method of claim 19, wherein at least one of the one or more field stops comprises:
at least one of an illumination field stop or a collection field stop formed from at least some of the one or more straight edges.

* * * * *